(12) United States Patent
Takeda et al.

(10) Patent No.: US 9,620,230 B2
(45) Date of Patent: Apr. 11, 2017

(54) MEMORY DEVICE THAT PERFORMS AN ADVANCE READING OPERATION

(71) Applicant: KABUSHIKI KAISHA TOSHIBA, Tokyo (JP)

(72) Inventors: Shinya Takeda, Yokohama Kanagawa (JP); Toshihiko Kitazume, Kawasaki Kanagawa (JP); Kenichirou Kada, Yokohama Kanagawa (JP); Nobuhiro Tsuji, Yokohama Kanagawa (JP); Shunsuke Kodera, Yokohama Kanagawa (JP); Tetsuya Iwata, Yokohama Kanagawa (JP); Yoshio Furuyama, Yokosuka Kanagawa (JP); Hirosuke Narai, Meguro Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/062,021

(22) Filed: Mar. 4, 2016

(65) Prior Publication Data

US 2017/0062063 A1 Mar. 2, 2017

(30) Foreign Application Priority Data

Aug. 28, 2015 (JP) ................... 2015-169362

(51) Int. Cl.
*G11C 16/26* (2006.01)
*G11C 16/08* (2006.01)

(52) U.S. Cl.
CPC .............. *G11C 16/26* (2013.01); *G11C 16/08* (2013.01)

(58) Field of Classification Search
CPC ................................ G11C 16/26; G11C 16/08
See application file for complete search history.

(56) References Cited

U.S. PATENT DOCUMENTS 8,225,047 B2 7/2012 Yano et al.
8,630,133 B2 1/2014 Rai et al.
(Continued)

FOREIGN PATENT DOCUMENTS

JP 4643667 B2 3/2011
JP 2012128921 A 7/2012
(Continued)

OTHER PUBLICATIONS

Toshiba MOS Digital Integrated Circuit Silicon Gate CMOS, TC58NVG0S3HTA00, Aug. 31, 2012, 51 pages.
(Continued)

*Primary Examiner* — Khamdan Alrobaie
(74) *Attorney, Agent, or Firm* — Patterson & Sheridan, LLP

(57) ABSTRACT

A memory device includes a semiconductor memory unit, and a controller configured to communicate with a host through a serial interface and access the memory semiconductor unit in response to commands received through the serial interface. The controller, in response to a first read command received through the serial interface to read data in a first page of the semiconductor memory unit, issues a first command to the semiconductor memory unit to read data in the first page and, in addition, a second command to read data in a second page that is consecutive to the first page and not specified in the first read command.

17 Claims, 21 Drawing Sheets

(56) References Cited

U.S. PATENT DOCUMENTS

| | | | |
|---|---|---|---|
| 8,972,627 B2 | 3/2015 | Strasser et al. | |
| 2007/0258295 A1* | 11/2007 | Kagan | G11C 7/1045 |
| | | | 365/193 |
| 2012/0110246 A1* | 5/2012 | Rolandi | G11C 16/26 |
| | | | 711/103 |
| 2012/0155178 A1 | 6/2012 | Ohta et al. | |
| 2012/0320672 A1* | 12/2012 | Meir | G11C 7/06 |
| | | | 365/185.03 |
| 2016/0179697 A1* | 6/2016 | Park | G06F 12/1009 |
| | | | 711/206 |

FOREIGN PATENT DOCUMENTS

| | | |
|---|---|---|
| TW | 201133239 A | 10/2011 |
| TW | 201246083 A | 11/2012 |
| TW | I494757 B | 8/2015 |

OTHER PUBLICATIONS

Toshiba MOS Digital Integrated Circuit Silicon Gate CMOS, TC58BVG0S3HTA00, Aug. 31, 2012, 44 pages.
Taiwan Office Action dated Sep. 14, 2016, filed in Taiwan counterpart Application No. 105103854, 5 pages (with translation).

* cited by examiner

FIG. 3

| Pin no. | Pin function |
|---|---|
| 1 | Hold input(/HOLD) / serial data output3(SO3) |
| 2 | Power supply(Vcc) |
| 3 | No connection(NC) |
| 4 | No connection(NC) |
| 5 | No connection(NC) |
| 6 | No connection(NC) |
| 7 | Chip select(/CS) |
| 8 | Serial data output(SO) / serial data output1(SO1) |
| 9 | Write protect(/WP) / serial data output2(SO2) |
| 10 | Ground(Vss) |
| 11 | No connection(NC) |
| 12 | No connection(NC) |
| 13 | No connection(NC) |
| 14 | No connection(NC) |
| 15 | Serial data input(SI) / serial data output0(SO0) |
| 16 | Serial clock input(SCK) |

FIG. 4

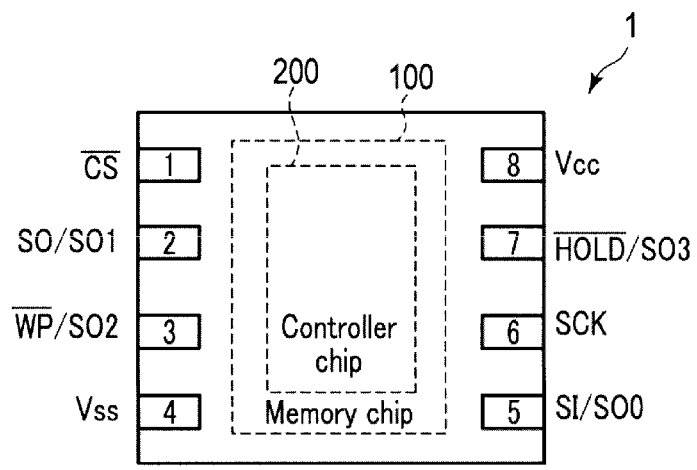

FIG. 5

| Pin no. | Pin function |
|---|---|
| 1 | Chip select(/CS) |
| 2 | Serial data output(SO) / serial data output1(SO1) |
| 3 | Write protect(/WP) / serial data output2(SO2) |
| 4 | Ground(Vss) |
| 5 | Serial data input(SI) / serial data output0(SO0) |
| 6 | Serial clock input(SCK) |
| 7 | Hold input(/HOLD) / serial data output3(SO3) |
| 8 | Power supply(Vcc) |

MEMORY DEVICE THAT PERFORMS AN ADVANCE READING OPERATION

CROSS-REFERENCE TO RELATED APPLICATION

This application is based upon and claims the benefit of priority from Japanese Patent Application No. 2015-169362, filed Aug. 28, 2015, the entire contents of which are incorporated herein by reference.

FIELD

Embodiments described herein relate generally to a memory device, in particular, a memory device that performs an advance reading operation.

BACKGROUND

NAND-type flash memory is widely known as a memory device.

DESCRIPTION OF THE DRAWINGS

FIG. 3 illustrates functions of external terminals of the memory system according to the first embodiment.

FIG. 4 is an exterior plan view of another memory system according to the first embodiment.

FIG. 5 illustrates functions of external terminals of the memory system shown in FIG. 4.

DETAILED DESCRIPTION

Figure 1:
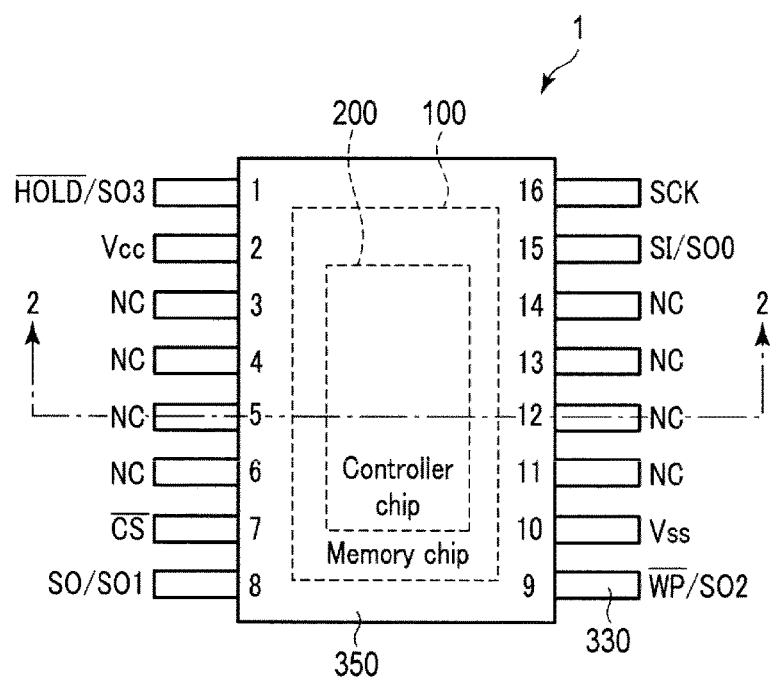
FIG. 1 is an exterior plan view of a memory system according to a first embodiment.

One or more embodiments provide a memory system capable of performing a reading operation in a shorter period of time.

In general, according to an embodiment, a memory device includes a semiconductor memory unit, and a controller configured to communicate with a host through a serial interface and access the memory semiconductor unit in response to commands received through the serial interface. The controller, in response to a first read command received through the serial interface to read data in a first page of the semiconductor memory unit, issues a first command to the semiconductor memory unit to read data in the first page and, in addition, a second command to read data in a second page that is consecutive to the first page and not specified in the first read command.

Hereinafter, embodiments will be described with reference to the drawings. In the following description, configuring elements having the same function and configuration are described with common reference numerals.

1. First Embodiment

A memory system according to a first embodiment will be described.

1.1 Configuration 1.1.1 Entire Configuration of Memory System

First, an entire configuration of the memory system according to the present embodiment will be described with reference to FIGS. 1 and 2. FIG. 1 is an exterior plan view of the memory system according to the present embodiment, and FIG. 2 is a cross-sectional view thereof taken along the line II-II in FIG. 1.

As illustrated, a memory system 1 includes two semiconductor chips (modules) 100 and 200. The semiconductor chip (memory chip) 100 includes a semiconductor memory such as a NAND-type flash memory, and the semiconductor chip 200 (controller chip) includes a controller which controls the memory chip 100. The semiconductor chips 100 and 200 are mounted on a lead frame 300, and are packaged by being sealed with a resin 350.

Figure 2:
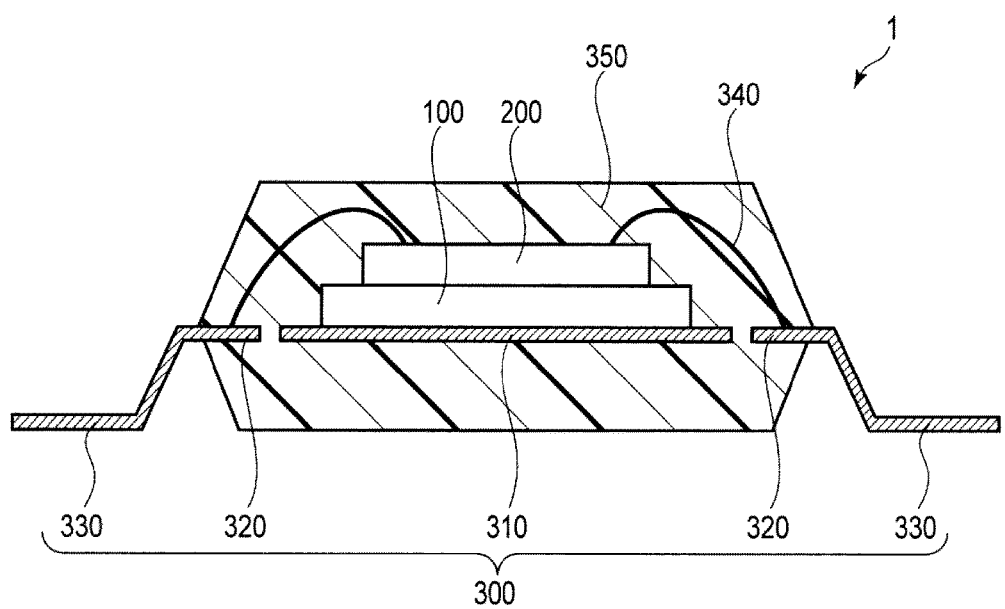
FIG. 2 is a cross-sectional view of the memory system according to the first embodiment.

More specifically, as illustrated in FIG. 2, the memory chip 100 is mounted on a die pad 310 of the lead frame 300, and the controller chip 200 is superposed on the memory chip 100.

The controller chip 200 is connected to an inner lead 320 of the lead frame via, for example, a bonding wire 340, and is also connected to the memory chip 100 via a bonding wire (not illustrated). The memory chip 100, the controller chip 200, the die pad 310, the inner lead 320, and the bonding wire 340 are sealed with, for example, the resin 350.

The inner lead 320 is connected to an outer lead 330 which is exposed to the outside of the resin 350. The outer lead 330 functions as an external connection terminal (external connection pin) of the memory system 1. In FIG. 1, sixteen external connection terminals including a first pin to a sixteenth pin are provided. The memory system 1 performs communication with a host apparatus which controls the memory system 1 (more specifically, accesses the memory chip) via the pins.

FIG. 3 illustrates functions of the respective pins. As illustrated, the first pin is used to receive a control signal /HOLD, or to output serial data SO3. The control signal /HOLD is asserted (has an "L" level) when communication between the host apparatus and the memory system 1 is temporarily stopped. The second pin receives a power supply voltage Vcc. The third to sixth pins and the eleventh to fourteenth pins are reserved pins, and may be used, for example, when a certain signal or data are required to be transmitted and received in the future. The seventh pin receives a chip select signal /CS. The chip select signal /CS is a signal for activating the memory chip 100 and the controller chip 200 (in other words, a signal is asserted when accessing the memory system 1), and is asserted (has an "L" level), for example, at a timing at which the host apparatus inputs a command to the memory system 1. The eighth pin is used to output serial data (SO or SO1). The ninth pin is used to receive a control signal /WP or to output serial data (SO2). The control signal /WP is a write protect signal, and is asserted (has an "L" level) when writing to the memory chip is prohibited. The tenth pin receives a reference potential Vss. The fifteenth pin is used to receive serial data (SI) or to output serial data (SO0). The sixteenth pin receives a serial clock signal SCK.

The pin configuration conforms to the serial peripheral interface (SPI). The first pin, the eighth pin, the ninth pin, and the fifteenth pin are arbitrarily selected for use in outputting serial data, and can output data to the host apparatus at 1-time speed, 2-time speed or 4-time speed.

FIG. 4 illustrates an example of a package configuration which is different from the one illustrated in FIG. 1. In FIG. 4, eight external connection terminals including a first pin to an eighth pin are provided. FIG. 5 illustrates functions of the respective pins shown in FIG. 4.

As illustrated, the first pin receives the chip select signal /CS. The second pin outputs the serial data SO and SO1. The third pin receives the write protect signal /WP or outputs the serial data SO2. The fourth pin receives the reference potential Vss. The fifth pin receives the serial data SI or outputs the serial data SO0. The sixth pin receives the serial clock. The seventh pin receives the control signal /HOLD or outputs the serial data SO3. The eighth pin receives the power supply voltage Vcc. Also in this case, the pin configuration conforms to the SPI.

Figure 6:
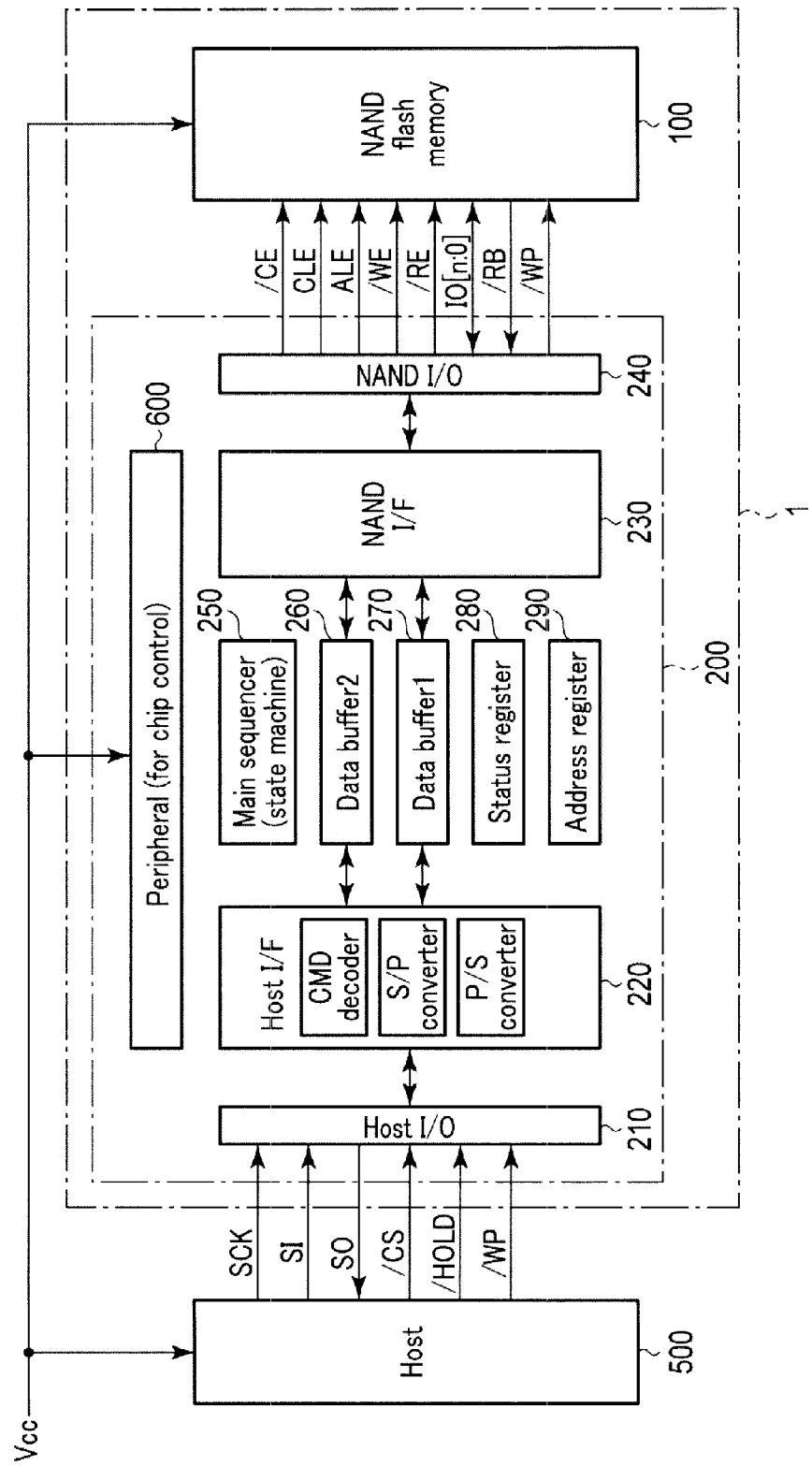
FIG. 6 is a block diagram of the memory system according to the first embodiment.

FIG. 6 is a functional block diagram illustrating an internal configuration of the memory system 1. Hereinafter, the memory chip 100 is referred to as a NAND-type flash memory 100, and the controller chip 200 is simply referred to as a controller 200.

As illustrated, the memory system 1 includes the NAND-type flash memory 100 and the controller 200.

The NAND-type flash memory 100 includes a plurality of memory cells and stores data in a nonvolatile manner. The controller 200 is connected to the NAND-type flash memory 100 via NAND buses, and is connected to a host apparatus 500 via SPI buses. The controller 200 controls access to the NAND-type flash memory 100.

Each of the NAND buses performs transmission and reception of signals based on a NAND interface protocol. Specific examples of the signals include a chip enable signal /CE, an address latch enable signal ALE, a command latch enable signal CLE, a write enable signal /WE, a read enable signal /RE, a ready busy signal /RB, an input or output signal I/O, and a write protect signal /WP.

The signal /CE is asserted in a low level so as to activate the NAND-type flash memory 100, when accessing the NAND-type flash memory 100. The signals CLE and ALE are used to notify the NAND-type flash memory 100 that input signals I/O to the NAND-type flash memory 100 are respectively a command and an address. The signal /WE is asserted in a low level so that the input signal I/O is input to the NAND-type flash memory 100. The signal /RE is also asserted in a low level so that the output signal I/O is read from the NAND-type flash memory 100. The ready busy signal /RB indicates whether the NAND-type flash memory 100 is in a ready state (a state of being capable of receiving a command from the controller 200) or in a busy state (a state of being incapable of receiving a command from the controller 200), and a low level thereof indicates the busy state. The input or output signal I/O is, for example, an 8-bit (n=8) signal. The input or output signal I/O is the entity of data which are transmitted and received between the NAND-type flash memory 100 and the controller 200, and includes a command, an address, data to be written, and read data. The signal /WP is a signal for prohibiting data from being written to the NAND-type flash memory 100.

The SPI buses are substantially similar to the ones described with reference to FIGS. 3 and 5.

1.1.2 Configuration of Controller 200

Next, with reference to FIG. 6, details of a configuration of the controller 200 will be described. As illustrated, the controller 200 includes a host input/output circuit 210, a host interface circuit 220, a NAND interface circuit 230, a NAND input/output circuit 240, a sequencer (state machine) 250, data buffers 260 and 270, a status register 280, an address register 290, and a peripheral circuit 600.

The host input/output circuit 210 functions as a buffer of signals which are transmitted to and received from the host apparatus 500. The signals SCK, SI, /CS, /HOLD and /WP are first received by the host input/output circuit 210 and are then output to the host interface circuit 220.

The host interface circuit 220 receives the signal SI in synchronization with the signal SCK. The host interface circuit 220 transmits the signal SO which is received in synchronization with the signal SCK, to the host apparatus 500 via the host input/output circuit 210.

The host interface circuit 220 controls transmission and reception of signals with the host apparatus 500 via the host input/output circuit 210. The host interface circuit 220 functions as a serial/parallel converter and a parallel/serial converter. For example, the input signal SI from the host apparatus 500 is converted from a serial signal into a parallel signal, and data read from the NAND-type flash memory 100 is converted from a parallel signal into a serial signal. If the input signal SI is a command, the host interface circuit 220 functions as a command decoder and decodes the received command. A decoded result is output to, for example, the sequencer 250.

The data buffers 260 and 270 temporarily holds data to be written that are received from the host apparatus 500, via the host interface circuit 220. Data read from the NAND-type flash memory 100 is received via the NAND interface circuit 230 and temporarily held.

The status register 280 holds various kinds of status information of the memory system 1. For example, a feature table (described below) is held.

The address register 290 holds an address received from the host apparatus 500, via the host interface circuit 220.

The NAND interface circuit 230 controls transmission and reception of signals to and from the NAND-type flash memory 100 via the NAND input/output circuit 240. The NAND interface circuit 230 issues various commands conforming to the NAND interface protocol in response to a command from the sequencer 250, and outputs the commands to the NAND-type flash memory 100 along with an address in the address register 290 via the NAND input/output circuit 240. During writing of data, the data in the data buffer 260 and/or 270 is output to the NAND-type flash memory 100 via the NAND input/output circuit 240. During reading of data, data read from the NAND-type flash memory 100 is transmitted to the data buffer 260 and/or 270.

The NAND input/output circuit 240 functions as a buffer of signals which are transmitted to or received from the NAND-type flash memory 100. The NAND input/output circuit 240 asserts or deasserts the signals /CE, CLE, ALE, /WE, /RE and /WP in response to commands from the NAND interface circuit 230. During reading of data, the NAND input/output circuit 240 temporarily holds a signal IO (read data) and transmits the signal to the NAND interface circuit 230. During writing of data, the NAND input/output circuit 240 temporarily holds a signal IO (data to be written) and transmits the signal to the NAND-type flash memory 100. The ready busy signal /RB is received from the NAND-type flash memory 100 and is transmitted to the NAND interface circuit 230.

The sequencer 250 controls the entire operation of the controller 200. For example, if a data reading request is received from the host apparatus 500, the sequencer 250 instructs the NAND interface circuit 230 to execute an operation for performing a reading operation. If a data writing request is received from the host apparatus 500, the sequencer 250 instructs the NAND interface circuit 230 to execute an operation for performing a reading operation. The feature table in the status register 280 is updated based on status information received from the NAND-type flash memory 100.

The peripheral circuit 600 receives the power supply voltage Vcc from an external device, transmits the voltage to each circuit block, and performs other control which is necessary in an operation of the controller 200.

1.1.3 Configuration of NAND-Type Flash Memory 100

Figure 7:
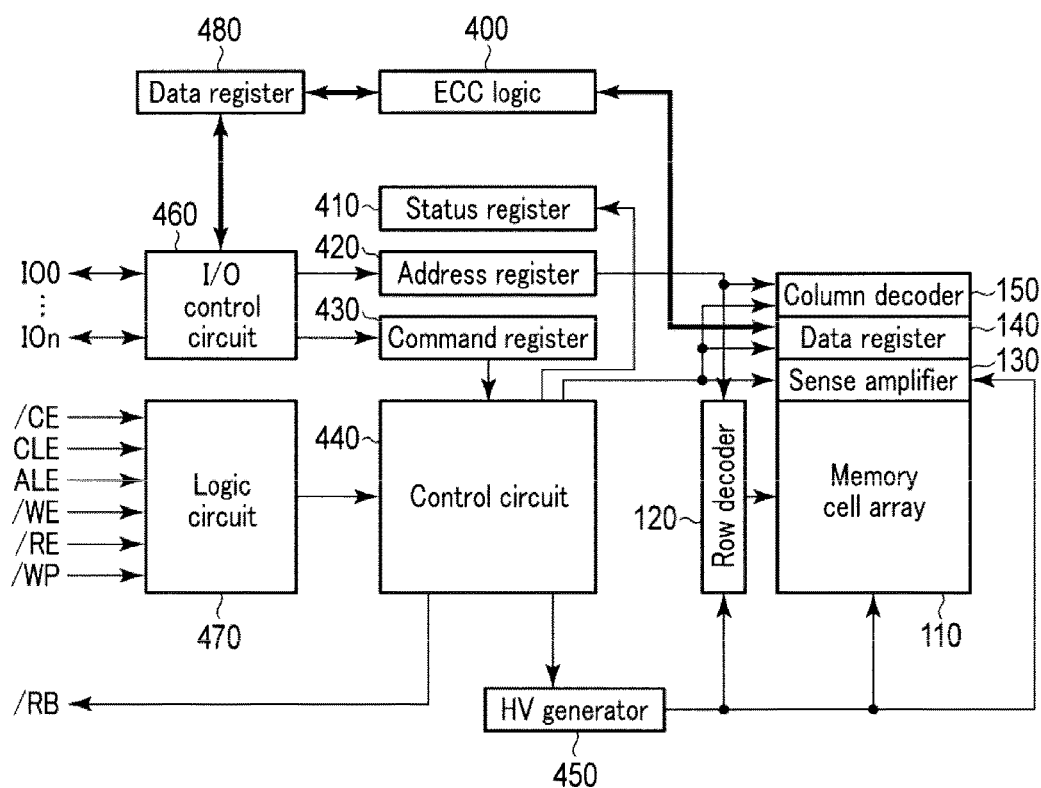
FIG. 7 is a block diagram of a semiconductor memory device according to the first embodiment.

Next, with reference to FIG. 7, a configuration of the NAND-type flash memory 100 will be described. FIG. 7 is a block diagram of the NAND-type flash memory 100.

As illustrated, the NAND-type flash memory 100 includes a memory cell array 110, a row decoder 120, a sense amplifier 130, a data register 140, a column decoder 150, an error correction code (ECC) circuit 400, a status register 410, an address register 420, a command register 430, a control circuit 440, a voltage generation circuit 450, an input/output control circuit 460, a logic circuit 470, and a data register 480.

The memory cell array 110 includes a plurality of non-volatile memory cells arranged in rows and columns. Memory cells in the same row are connected to the same word line, and memory cells in the same column are connected to the same bit line. Reading and writing of data are collectively performed on a plurality of memory cells connected to the same word line. This unit of the reading and writing of data is referred to as a page. Data corresponding to one page includes net data and management data. The net data are managed in the unit called a sector. For example, in the present embodiment, one page includes four sectors, and each sector has a data size of 512 bytes. The management data include, for example, ECC data (parity) for correcting errors. The error correction is performed in each sector. Therefore, the management data include ECC data which are prepared for each sector. Erasing of data is collectively performed in the units of a plurality of pages. The units are referred to as a block.

The row decoder 120 decodes a row address for designating a row of the memory cell array 110. A word line is selected based on a decoded result, and voltages which are required to write, read and erase data are applied thereto.

During reading of data, the sense amplifier 130 senses data read from the memory cell array 110 and transmits the data to the data register 140. During writing of data, data in the data register 140 are transmitted to the memory cell array 110.

The data register 140 temporarily holds data to be written or read data corresponding to one page.

The column decoder 150 decodes a column address of a column of the memory cell array 110. Based on a decoded result, data are transmitted to the data register during writing of data, and data are read from the data register during reading of data.

The ECC circuit 400 performs error detection and error correction processes. More specifically, during writing of data, the ECC circuit 400 generates parity for each sector based on data received from the controller 200, and transmits the parity and net data to the data register 140. During reading of data, the ECC circuit 400 generates a syndrome for each sector based on parity included in data transmitted from the data register 140, and detects the presence or absence of an error. If an error is detected, a bit position thereof is specified, and the error is corrected. The number of error bits which can be corrected for each sector is, for example, 8 bits per sector in the present embodiment. The ECC circuit 400 may output the number of error bits detected in each sector to the status register 410 as status information.

The logic circuit 470 receives the signals /CE, CLE, ALE, /WE, /RE and /WP from the controller 200.

The input/output control circuit 460 receives a signal IO [n:0]. If the signal IO is an address (if ALE="H"), the input/output control circuit 460 holds the address in the address register 420. If the signal IO is a command (if CLE="H"), the command is held in the command register 430. If the signal IO is data (if ALE=CLE="L"), the data are held in the data register 480.

The status register 410 holds various kinds of status information of the NAND-type flash memory 100. The status information includes information indicating the number of error bits provided from the ECC circuit 400, and information indicating whether or not a writing operation and a reading operation is successful (passed) or unsuccessful (failed), provided from the control circuit 440.

The control circuit 440 controls the entire NAND-type flash memory 100 based on commands held in the command register 430 and various signals input to the logic circuit 470. The control circuit 440 generates the ready busy signal /RB and outputs the signal to the controller 200.

The voltage generation circuit 450 generates voltage required in data writing, reading and erasing operations based on a command from the control circuit 440, and supplies the voltages to the memory cell array 110, the row decoder 120, and the sense amplifier 130.

1.2 Operations

Next, data reading, writing and erasing operations in the memory system according to the present embodiment will be described, focusing on signals which are transmitted and received via the SPI buses and the NAND buses.

1.2.1 Reading Operation

First, the reading operation will be described. The reading operation substantially includes the following three steps.

(1) Reading of data from the NAND-type flash memory: Through this step, data are read from the NAND-type flash memory 100 to the controller 200.

(2) Feature table reading (referred to as Get feature in some cases): Through this step, whether the memory system 1 is in a busy state or a ready state is determined, that is, whether or not the operation in the step (1) is completed is determined.

(3) Reading of data from the controller 200: Through this step, the data read to the controller 200 in the step (1) are read to the host apparatus 500.

Figure 8:
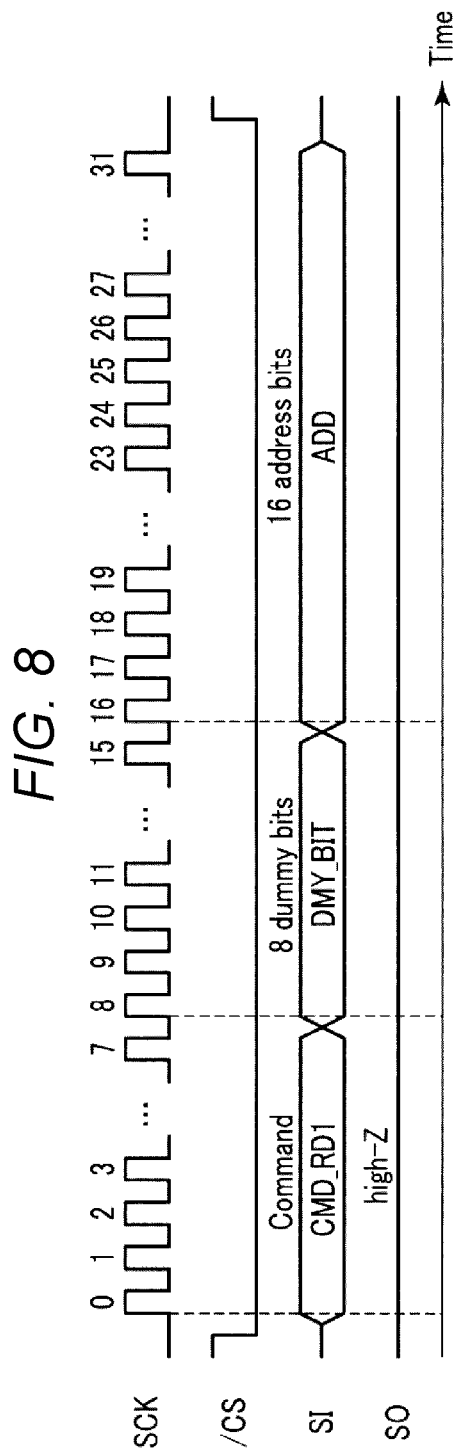
FIGS. 8-11 are timing charts of various signals during reading of data in the memory system according to the first embodiment.

FIG. 8 is a timing chart of various signals on the SPI buses during execution of the step (1). As illustrated, the host apparatus 500 asserts the signal /CS, issues a first read command CMD_RD1 as the signal SI, and also issues the clock SCK.

The host interface circuit 220 of the controller 200 recognizes the signal SI when the signal /CS is asserted and the initial clock SCK is received, as a command. The command is, for example, an 8-bit signal which is input for 8 clock cycles. The first read command CMD_RD1 is received, and then the sequencer 250 starts a data reading sequence.

Next, the host apparatus 500 transmits dummy bits DMY_ BIT to the controller 200, for example, for 8 clock cycles, and then transmits an address ADD to the controller 200, for example, for 16 clock cycles. After the address ADD is transmitted, the host apparatus 500 deasserts the signal /CS. The address ADD is an address for designating a block and a page in the NAND-type flash memory 100, and is held in the address register 290.

As described above, when a specific command is received, what kind of signal is subsequently input (command sequence) is defined in advance. In other words, for example, if the first read command CMD_RD1 is received, the controller 200 recognizes that the signal SI which is input for subsequent 8 clock cycles is meaningless dummy data, and the signal SI which is input subsequent 16 clock cycles is a substantial address signal.

Figure 9:
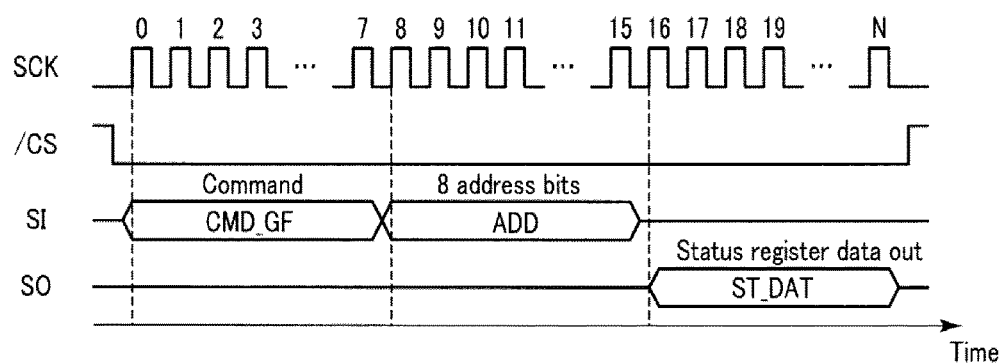

The operation in the step (2) is performed following the operation in the step (1). FIG. 9 is a timing chart of various signals on the SPI buses during execution in the step (2). As illustrated, the host apparatus 500 asserts the signal /CS again, issues a Get feature command CMD_GF as the signal SI, and also issues the clock SCK.

Next, the host apparatus 500 transmits an address ADD to the controller 200, for example, for 8 clock cycles. The address ADD is an address in the feature table, and is an address for naturally designating a region in which ready busy information is stored. In the controller 200, after the address ADD is received, the host interface circuit 220 reads an entry designated in the feature table from the status register 280 in response to a command from the sequencer 250, and transmits the entry to the host apparatus 500 as 8-bit status data ST_DAT for 8 clock cycles. The status data ST_DAT includes the ready busy information. After the status data ST_DAT is received, the host apparatus 500 deasserts the signal /CS.

Figure 10:
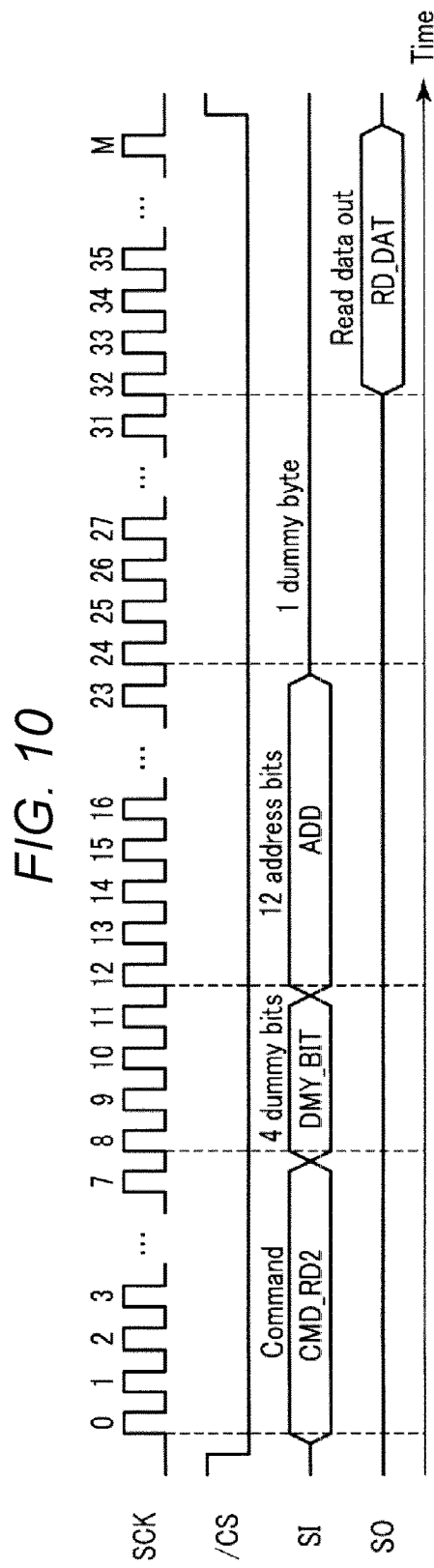

If the received status data ST_DAT indicates that the memory system 1 is in a ready state, the operation in the step (3) is performed. FIG. 10 is a timing chart of various signals on the SPI bus during execution of the step (3). As illustrated, the host apparatus 500 asserts the signal /CS, issues a second read command CMD_RD2 as the signal SI, and also issues the clock SCK.

Next, the host apparatus 500 transmits dummy bits DMY_ BIT to the controller 200, for example, for 4 clock cycles, and then transmits an address ADD to the controller 200, for example, for 12 clock cycles. The address ADD is an address for designating a region in the data buffer 260 or 270 of the controller 200, and is an address for designating a column of a page in the NAND-type flash memory 100. The address ADD is held in the address register 290. Then, the host interface circuit 220 reads data from the data buffer 260 or 270, for example, under the control of the sequencer 250.

After the 8 clock cycles, the host interface circuit 220 transmits the data RD_DAT read from the data buffer 260 or 270 to the host apparatus 500.

Figure 11:
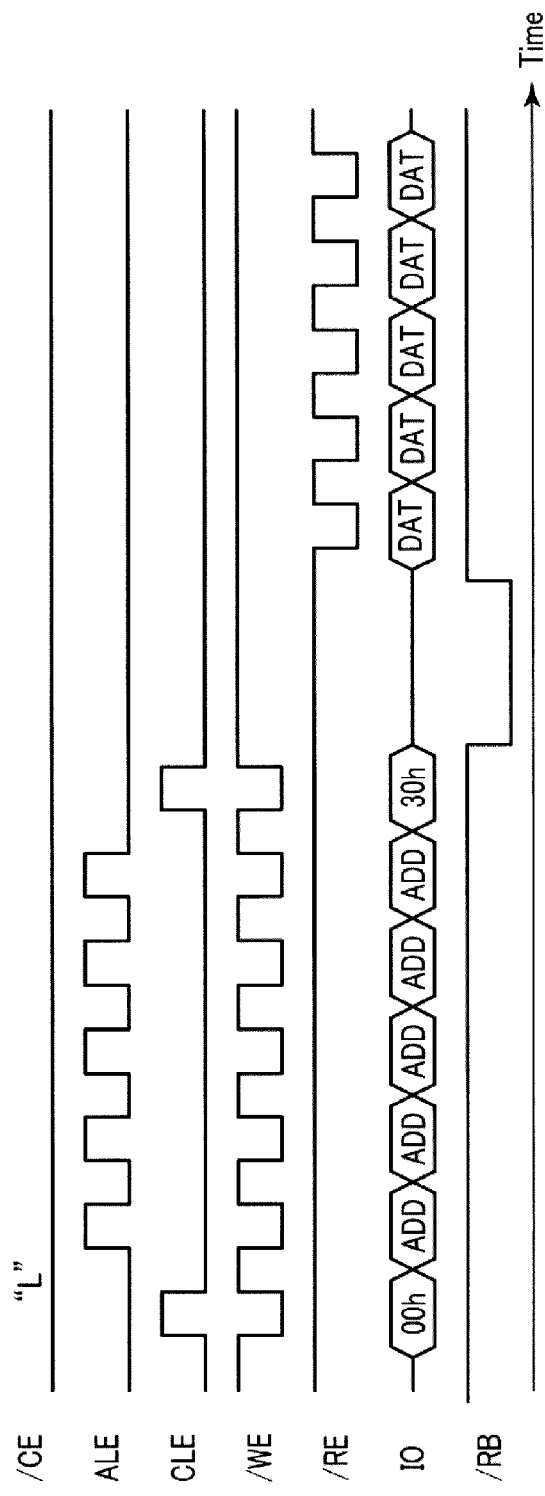

FIG. 11 is a timing chart of various signals on the NAND bus during execution of the step (1). After the first read command CMD_RD1 is received in the controller 200, the NAND interface circuit 230 issues an address input command "00h", for example, under the control of the sequencer 250, and transmits the command to the NAND-type flash memory 100. Subsequently, an address ADD is transmitted to the NAND-type flash memory 100, for example, for 5 clock cycles, and then a read command "30h" is issued and transmitted to the NAND-type flash memory 100. The address ADD includes addresses indicating a block, a page, and a column, held in the address register 290 in the operations illustrated in FIGS. 8 and 10.

An operation of reading data from the memory cell array 110 is started in the NAND-type flash memory 100 in response to the command "30h", and thus the NAND-type flash memory 100 is brought into a busy state (/RB="L").

If reading of the data from the memory cell array 110 is completed, the NAND-type flash memory 100 is brought into a ready state. The controller 200 toggles the signal /RE in response thereto. Then, the data are transmitted from the NAND-type flash memory 100 to the controller 200 in synchronization with the signal /RE.

1.2.2 Writing Operation

Next, the writing operation will be described. The writing operation substantially includes the following three steps.

(1) Transmission of data from the host apparatus 500 to the controller 200

(2) Writing of the transmitted data to the NAND-type flash memory 100

(3) Feature table reading (Get feature): Through this step, whether writing of the data to the NAND-type flash memory 100 is passed or failed is determined.

Figure 12:
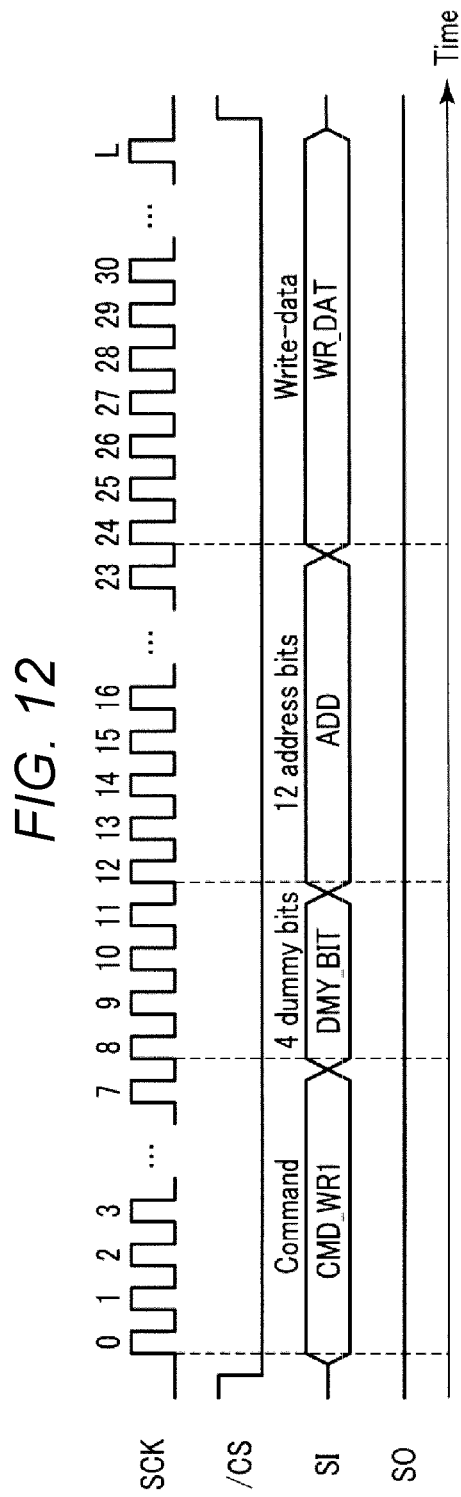
FIGS. 12-14 are timing charts of various signals during writing of data in the memory system according to the first embodiment.

FIG. 12 is a timing chart of various signals on the SPI buses during execution of the step (1). As illustrated, the host apparatus 500 asserts the signal /CS, issues a first write command CMD_WR1 as the signal SI, and also issues the clock SCK. If the first write command CMD_WR1 is received, the sequencer 250 starts a data writing sequence.

Next, the host apparatus 500 transmits dummy bits DMY_ BIT to the controller 200, for example, for 4 clock cycles, and then transmits an address ADD to the controller 200, for example, for 12 clock cycles. The address ADD is an address for designating a region in the data buffer 260 or 270, and is an address for designating a column of a page in the NAND-type flash memory 100. The address ADD is held in the address register 290. The host apparatus 500 transmits data to be written WR_DAT to the controller 200. The data to be written WR_DAT is held in the region corresponding to the address ADD received right before, in the data buffer 260 or 270. After the data WR_DAT is transmitted, the host apparatus 500 deasserts the signal /CS.

Figure 13:
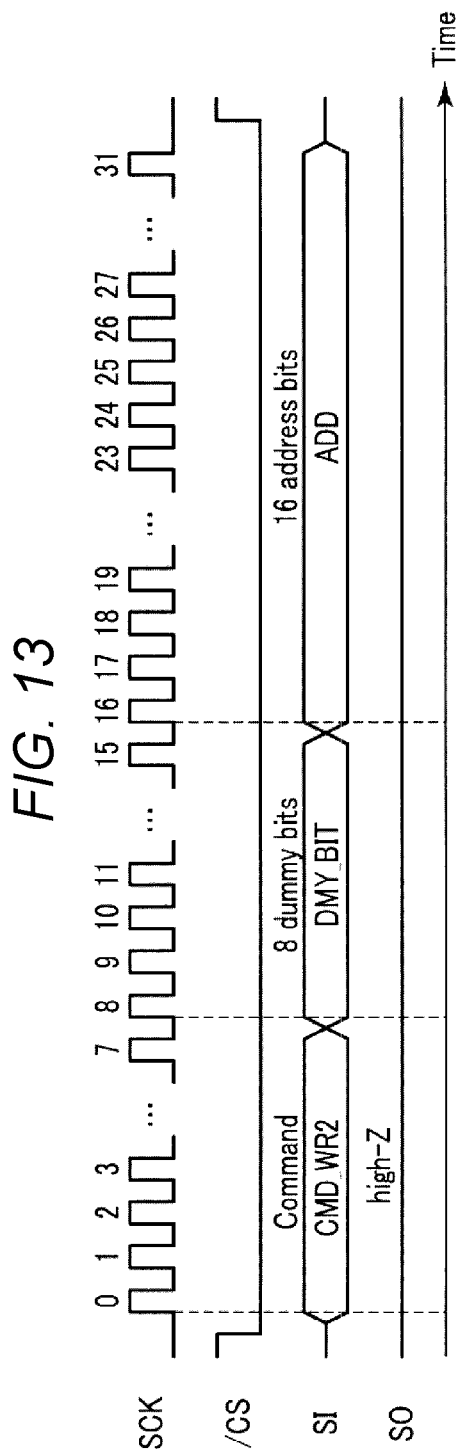

The step (2) is performed following the step (1). FIG. 13 is a timing chart of various signals on the SPI bus during execution of the step (2). As illustrated, the host apparatus 500 asserts the signal /CS again, issues a second write command CMD_WR2 as the signal SI, and also issues the clock SCK. If the second write command CMD_WR2 is received, the sequencer 250 recognizes that a command for the step (2) is received.

Next, the host apparatus 500 transmits 8 dummy bits DMY_BIT to the controller 200, for example, for 8 clock cycles, and then transmits a 16-bit address ADD to the controller 200, for example, for 16 clock cycles. The address ADD is an address for designating a block and a page in the NAND-type flash memory 100, and is held in the address register 290. After the address ADD is transmitted, the host apparatus 500 deasserts the signal /CS.

The step (3) is performed following the step (2). A command sequence in this operation is the same as in FIG. 9 referred to for description of the reading operation. If the received status data ST_DAT indicates that the memory system 1 is in a ready state, the host apparatus 500 subsequently makes a request for information indicating whether writing of data is passed or failed.

Figure 14:
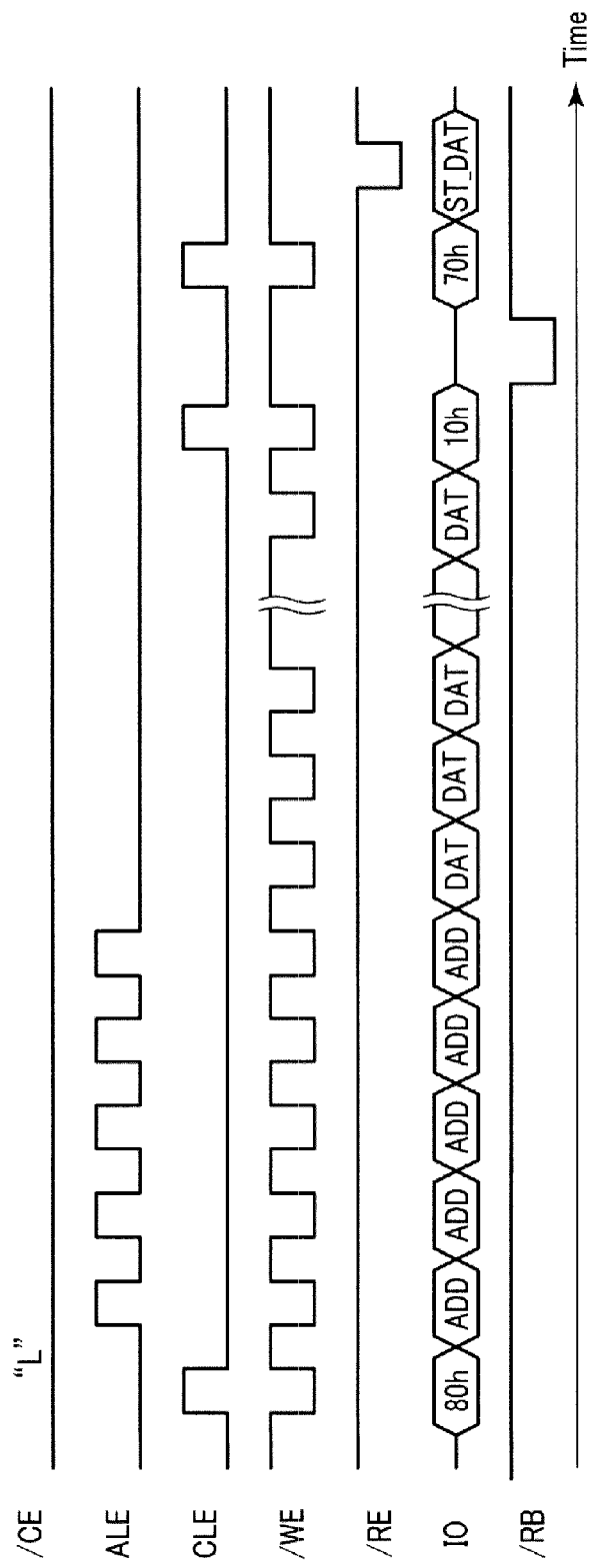

FIG. 14 is a timing chart of various signals on the NAND buses during execution of the step (2). After the second write command CMD_WR2 is received in the controller 200, the NAND interface circuit 230 issues a write command "80h", for example, under the control of the sequencer 250, and transmits the command to the NAND-type flash memory 100. Subsequently, an address ADD is transmitted to the NAND-type flash memory 100, for example, for 5 clock cycles, and data to be written DAT is transmitted to the NAND-type flash memory 100 for a plurality of clock cycles. Then, a write command "10h" is issued and is transmitted to the NAND-type flash memory 100. The address ADD includes addresses indicating a block, a page, and a column, held in the address register 290 in the operations illustrated in FIGS. 12 and 13.

An operation of writing the data to the memory cell array 110 is started in the NAND-type flash memory 100 in response to the command "10h", and thus the NAND-type flash memory 100 is brought into a busy state (/RB="L").

If writing of the data to the memory cell array 110 is completed, the NAND-type flash memory 100 is brought into a ready state. The controller 200 reads a status, issues a command "70h", and toggles the signal /RE, in response thereto. Then, status data ST_DAT indicating whether the writing operation is passed or failed is transmitted to the controller 200 in synchronization with the signal /RE. The status data ST_DAT is held in the feature table, and is read to the host apparatus 500 in response to the Get feature command in the step (3).

1.2.3 Erasing Operation

Next, the erasing operation will be described. The erasing operation substantially includes the following two steps.

(1) An erase (delete) command is issued from the host apparatus 500 to the controller 200.

(2) Feature table reading (Get feature): Through this step, whether the erasing operation on the NAND-type flash memory 100 is passed or failed is determined.

Figure 15:
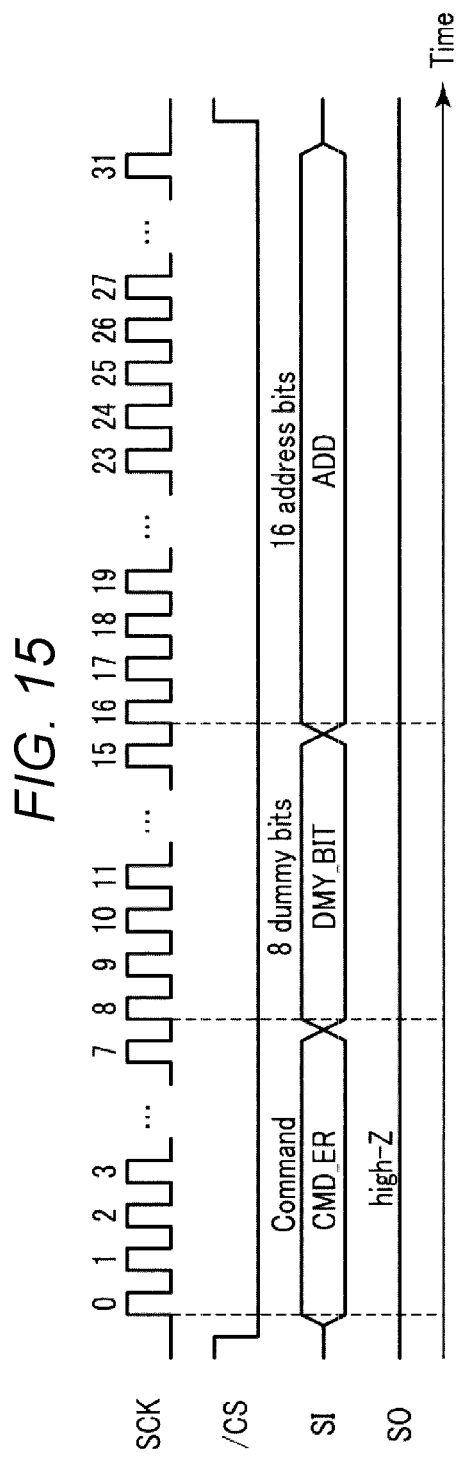
FIGS. 15-16 are timing charts of various signals during erasing of data in the memory system according to the first embodiment.

FIG. 15 is a timing chart of various signals on the SPI buses during execution of the step (1). As illustrated, the host apparatus 500 asserts the signal /CS, issues an erase command CMD_ER as the signal SI, and also issues the clock SCK. If the erase command CMD_ER is received, the sequencer 250 starts a data erasure sequence.

Next, the host apparatus 500 transmits 8 dummy bits DMY_BIT to the controller 200, for example, for 8 clock cycles, and then transmits a 16-bit address ADD to the controller 200, for example, for 16 clock cycles. The address ADD is an address for designating an erasure target block in the memory cell array 110, and is held in the address register 290. Subsequently, the host apparatus 500 deasserts the signal /CS.

The step (2) is performed following the step (1). A command sequence in this operation is the same as in FIG. 9 referred to for description of the reading operation. If the received status data ST_DAT indicates that the memory system 1 is in a ready state, the host apparatus 500 subsequently makes a request for information indicating whether erasure of the data is passed or failed.

Figure 16:
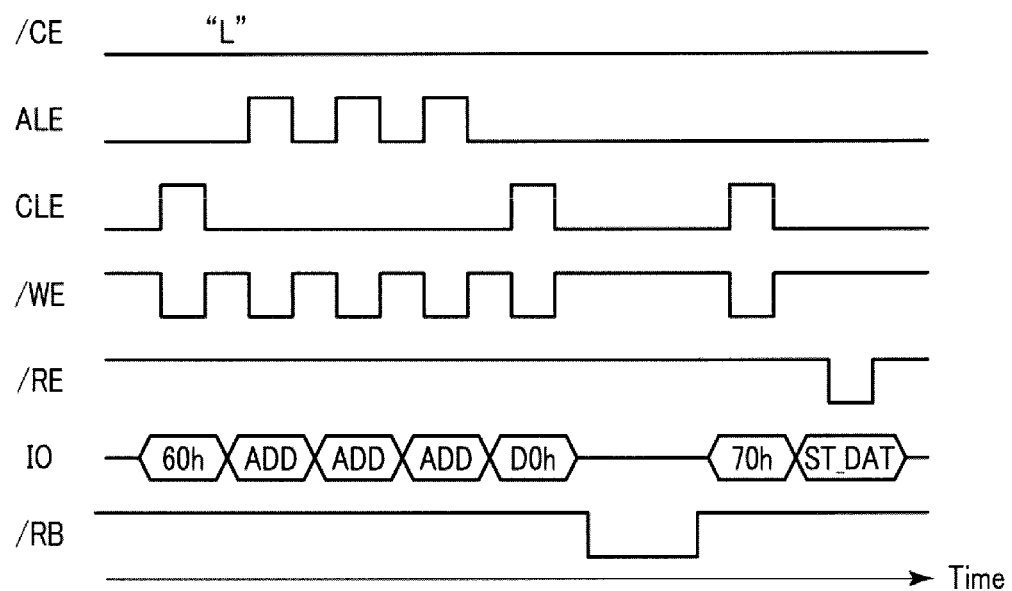

FIG. 16 is a timing chart of various signals on the NAND buses during execution of the step (1). After the erase command CMD_ER is received in the controller 200, the NAND interface circuit 230 issues a write command "60h", for example, under the control of the sequencer 250, and transmits the command to the NAND-type flash memory 100. Subsequently, an address ADD is transmitted to the NAND-type flash memory 100, for example, for 3 clock cycles, and then an erase command "D0h" is issued and is transmitted to the NAND-type flash memory 100.

An operation of erasing data from the memory cell array 110 is started in the NAND-type flash memory 100 in response to the command "D0h", and thus the NAND-type flash memory 100 is brought into a busy state (/RB="L").

If erasing of the data from the memory cell array 110 is completed, the NAND-type flash memory 100 is brought into a ready state. The controller 200 reads a status, issues a command "70h", and toggles the signal /RE, in response thereto. Then, status data ST_DAT indicating whether the erasing operation is passed or failed is transmitted to the controller 200 in synchronization with the signal /RE. The status data ST_DAT is held in the feature table, and is read to the host apparatus 500 in response to the Get feature command during the step (2).

1.3 Advance Reading Operation (Advance Reading Operation of the First Embodiment)

In the present embodiment, an advance reading operation is performed separately from the normal reading operation described in the above "1.2.1 Reading operation". Hereinafter, the advance reading operation will be described. In the following description, detailed description of the same components as in the description of the memory system will be omitted.

Figure 17:
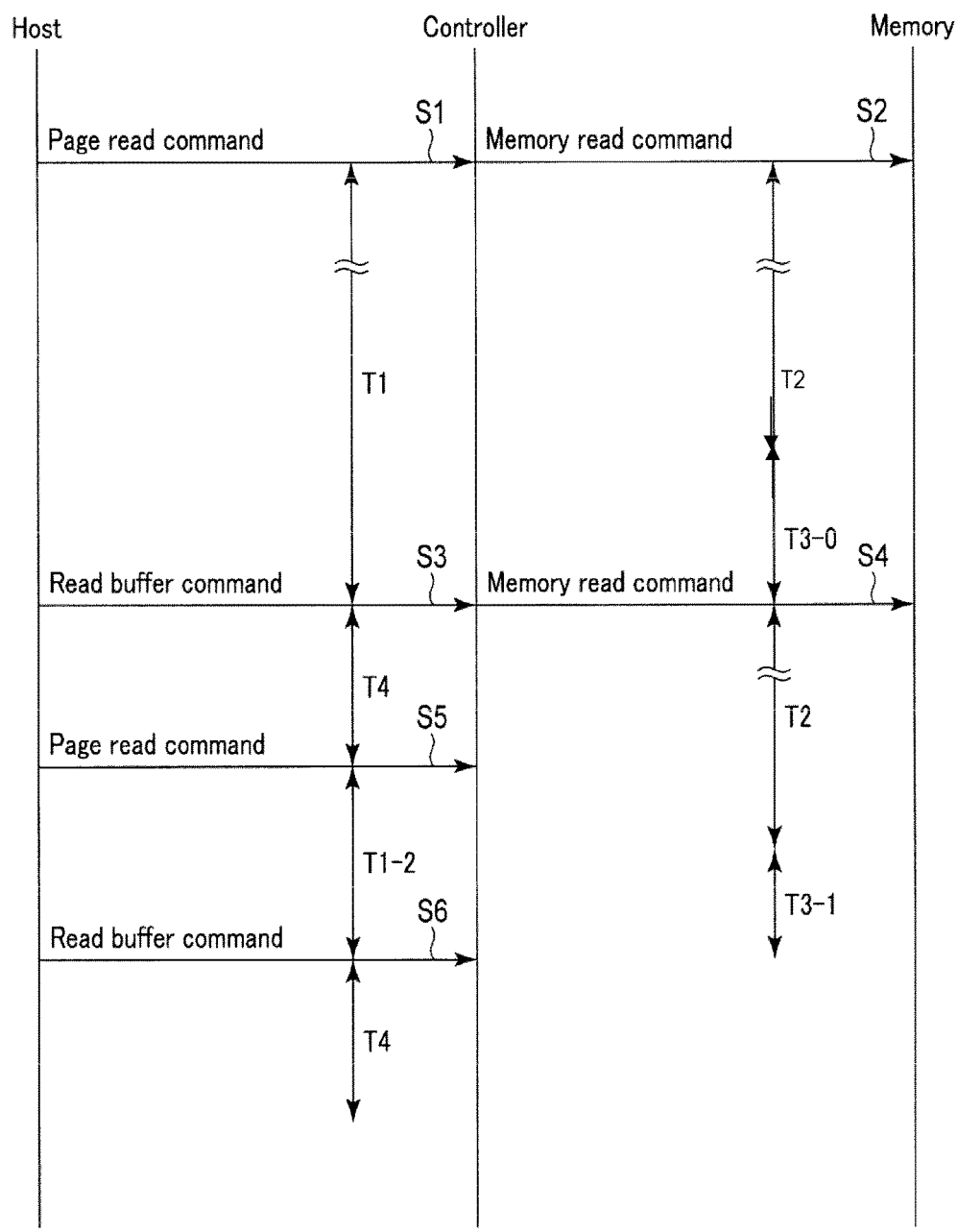
FIG. 17 is a flowchart illustrating an advance reading operation according to the first embodiment.

For better understanding of the present embodiment, description of the Get feature command in the above-described reading operation will be omitted, and the description will be focused on the first read command CMD_RD1 (corresponding to a page read command on the SPI bus (host bus) in FIG. 17) and the second read command CMD_RD2 (corresponding to a read buffer command on the SPI bus in FIG. 17).

In the present embodiment, the following advance reading operation is performed as long as there is no explicit instruction from the host apparatus 500.

Figure 18:
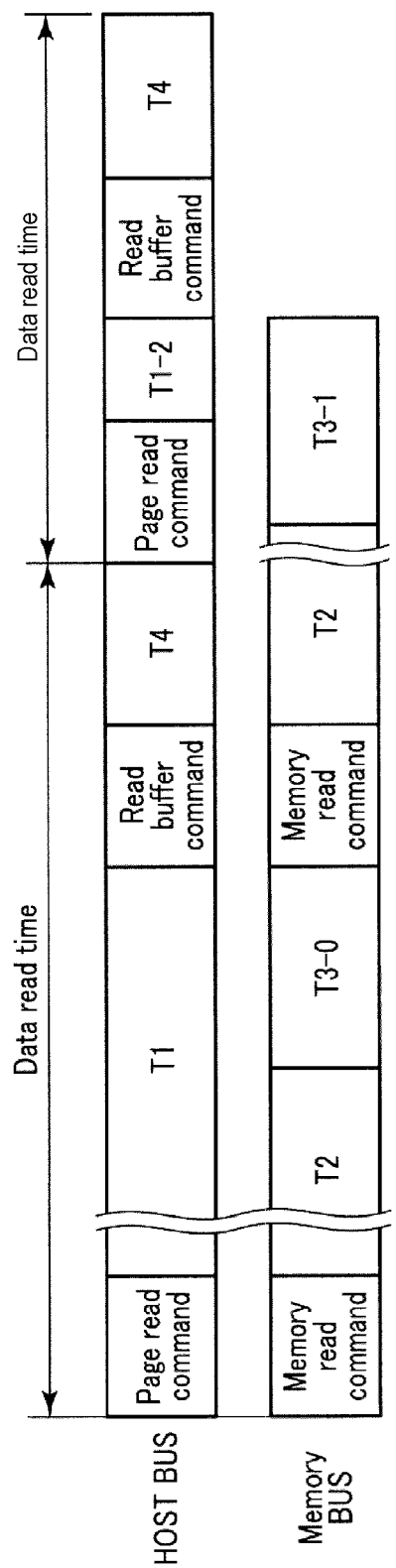
FIG. 18 is a timing chart of the advance reading operation according to the first embodiment.

FIG. 17 is a flowchart illustrating the advance reading operation according to the first embodiment. FIG. 18 is a timing chart of the advance reading operation according to the first embodiment.

As described above, the host apparatus 500 asserts the signal /CS and also issues a page read command on the SPI bus (host bus) (step S1).

The host interface circuit 220 of the controller 200 recognizes, as a command, the signal SI when the signal /CS is asserted and the initial clock SCK is received. The command is an 8-bit signal which is input, for example, for 8 clock cycles, and regarded as the page read command.

Next, the host apparatus 500 transmits dummy bits DMY_BIT to the controller 200, for example, for 8 clock cycles, and then transmits an address ADD to the controller 200, for example, for 16 clock cycles. After the address ADD is transmitted, the host apparatus 500 deasserts the signal /CS. The address ADD is an address for designating a block and a page in the NAND-type flash memory 100, and held in the address register 290. By receiving the command and the address, the sequencer 250 starts a data reading sequence.

Then, by reading the feature table, whether the memory system 1 is in a busy state or a ready state, that is, whether or not an operation related to the page read command on the host bus is completed is determined.

A feature table reading operation is described in the above "1.2.1 Reading Operation", and detailed description thereof will be omitted.

After the page read command on the SPI bus is received, the controller 200 issues a memory read command to the NAND-type flash memory 100 via the NAND bus (step S2).

Specifically, the NAND interface circuit 230 issues a command "00h" and transmits the command to the NAND-type flash memory 100. Subsequently, an address ADD is transmitted to the NAND-type flash memory 100, for example, for 5 clock cycles, and then a read command "30h" is issued and transmitted to the NAND-type flash memory 100. The address ADD includes addresses indicating a block, a page, and a column, held in the address register 290 in the operations illustrated in FIGS. 8 and 10.

An operation of reading data from the memory cell array 110 is started in the NAND-type flash memory 100 in response to the command "30h", and then the NAND-type flash memory 100 is brought into a busy state (/RB="L").

If reading of the data from the memory cell array 110 is completed, the NAND-type flash memory 100 is brought into a ready state. The controller 200 toggles the signal /RE in response thereto. Then, the data are transmitted from the NAND-type flash memory 100 to the controller 200 in synchronization with the signal /RE.

On the other hand, the controller 200 receives a read buffer command from the host apparatus 500 via the SPI bus after a busy state (T1 in FIGS. 17 and 18) of the SPI bus ends (step S3).

After a read busy time (T2 in FIG. 17) of the NAND-type flash memory 100 and a data transmission period (T3-0 in FIGS. 17 and 18) for data transfer from the NAND-type flash memory 100 to the data buffer 270 (data buffer 1) of the controller 200, the controller 200 issues a memory read command to the NAND-type flash memory 100 via the NAND bus when the read buffer command is received in step S3 (step S4).

Consequently, data can be transmitted from the controller 200 to the host apparatus 500 via the SPI bus, and the data can also be transmitted from the NAND-type flash memory 100 to the controller 200 via the NAND bus.

A timing at which the memory read command is issued in step S4 is not limited thereto. A timing at which the memory read command is issued in step S4 may be timing before the controller 200 receives the next page read command from the host apparatus 500.

Thereafter, the controller 200 waits for a read busy time (T2 in FIG. 17) of the NAND-type flash memory 100 and a data transmission period (T3-1 in FIGS. 17 and 18) from the NAND-type flash memory 100 to the data buffer 260 (data buffer 2) of the controller 200.

Here, in the first embodiment, a page address of the memory read command transmitted to the NAND-type flash memory 100 in step S4 is a page address subsequent to a page address of the memory read command transmitted to the NAND-type flash memory 100 in step S2.

After a data transmission period (T4 in FIGS. 17 and 18) from the controller 200 to the host apparatus 500 ends, the controller 200 receives the next page read command (step S5). Next, after a host read busy period (T1-2 in FIGS. 17 and 18) ends during the advance reading operation, a read buffer command is received (step S6).

Following step S6, the controller 200 receives the next page read command after the data transmission period (T4 in FIGS. 17 and 18) for data transfer from the controller 200 to the host apparatus 500 ends.

According to the first embodiment, since the memory read command is transmitted and thus data are already read to the data buffer 260 of the controller 200 when the read buffer command is received in step S4, the host read busy period of the SPI bus can be reduced when reading data sequentially.

Specifically, a busy cancel period corresponding to reading of a page to the host apparatus 500 substantially equals to the read busy period (T2) of the NAND-type flash memory 100+the data transmission period (T3-0 or T3-1) from the NAND-type flash memory 100 to the data buffers 260 and 270–the data transmission period (T4) from the buffer to the host apparatus 500 when a command issuing period is not considered. As a result, the read period can be reduced.

Figure 19:
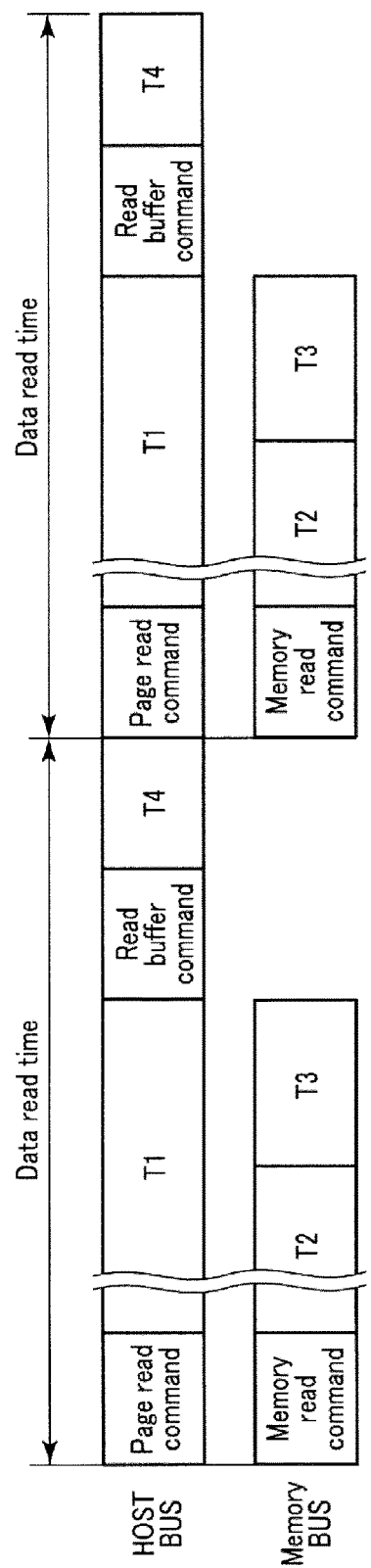
FIG. 19 is a timing chart of a conventional reading operation.

FIG. 19 is a timing chart of a reading operation for comparison. As illustrated in FIG. 19, the controller 200 performs no process regarding the read buffer command on the NAND bus.

The advance reading operation according to the present embodiment is performed or not performed based on an instruction from the host apparatus 500. Specifically, execution information regarding the advance reading operation is stored in, for example, the feature table of the status register 280, but may be stored in other locations.

In the first embodiment, the execution information regarding the advance reading operation indicates execution of the advance reading operation as a default (during activation), but is not limited thereto.

In the advance reading method according to the first embodiment, an explicit instruction from the host apparatus 500 is not necessary. For this reason, a special host apparatus 500 is not required to be prepared. However, in the advance reading method according to the present embodiment, significant advantage may not be expected in random address data reading compared with sequential address data reading.

To employ the advance reading operation efficiently, the normal reading operation and the advance reading operation according to the first embodiment may be switched in response to an instruction from the host apparatus 500.

Specifically, for example, a register for switching the normal reading operation and the advance reading operation of the first embodiment may be provided at a predetermined address of the feature table, and execution and non-execution of the advance reading operation may be switched based on information of the register. For example, if a value of the register is "1", the advance reading operation is performed, and if a value of the register is "0", the advance reading operation is not performed.

The information of the register for switching execution and non-execution of the advance reading operation stored in the feature table may be set by using a command regarding reading such as the read command or the buffer read command.

The register for the advance reading operation may be referred to whenever the buffer read command or the page read command is issued from the host apparatus 500, and the advance reading operation may be selected based on a state of the host apparatus 500 or the controller 200.

A condition to switch the normal reading operation and the advance reading operation of the first embodiment in the host apparatus 500 is as follows, for example, but is not limited thereto.

First, the host apparatus 500 analyzes a plurality of read commands (step S31). Specifically, the host apparatus 500 determines whether or not a plurality of consecutive read commands is used to read data stored in consecutive page addresses.

If the plurality of consecutive read commands is determined as being used to read the data stored in the consecutive page addresses in step S31, a value of the register to switch the operation is set to "1" before starting reading of the data, and the advance reading operation is caused to be performed (step S32).

On the other hand, if the plurality of consecutive read commands is not used to read the data stored in the consecutive page addresses, that is, data stored in non-consecutive page addresses are read, a value of the register to switch the operation is set to "0" before starting reading of the data, and the advance reading operation is caused not to be performed (step S33).

The number of a plurality of pages may be set as any number of 2 or more.

According to the first embodiment, since the register for the advance reading operation is provided, unnecessary advance reading operations are not performed, and thus a wasteful operation (power consumption) can be minimized.

Since the plurality of data buffers is provided, transfer of data to the host apparatus 500 and reading of data from the NAND-type flash memory 100 can be performed at the same time, and thus data reading time can be reduced.

2. Second Embodiment of Advance Reading Operation

In the advance reading operation according to the first embodiment, if the sequential address data reading is performed, reading performance can be improved, but if the random sequential address reading is performed, the reading performance is unlikely to be improved.

In the second embodiment, the reading performance is improved in data reading other than the sequential address data reading by defining a command which causes advance reading of any page to be performed in response to an instruction from the host apparatus 500.

Figure 20:
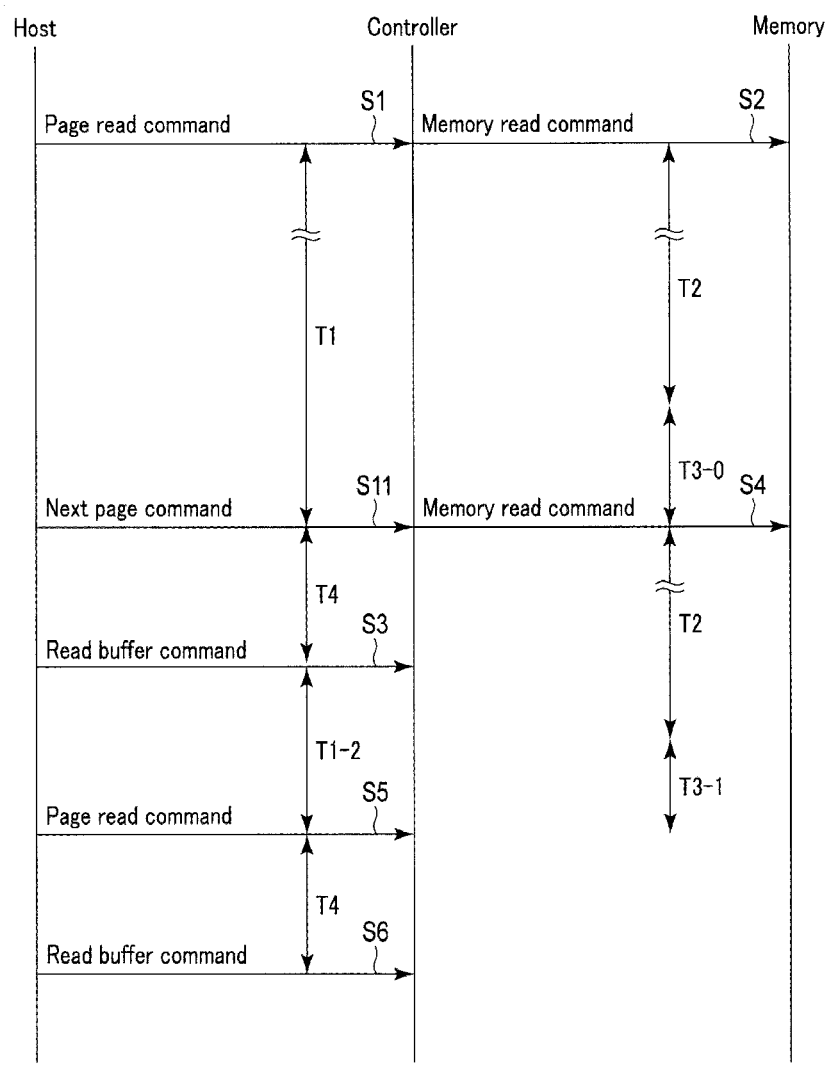
FIG. 20 is a flowchart illustrating an advance reading operation according to a second embodiment.
Figure 21:
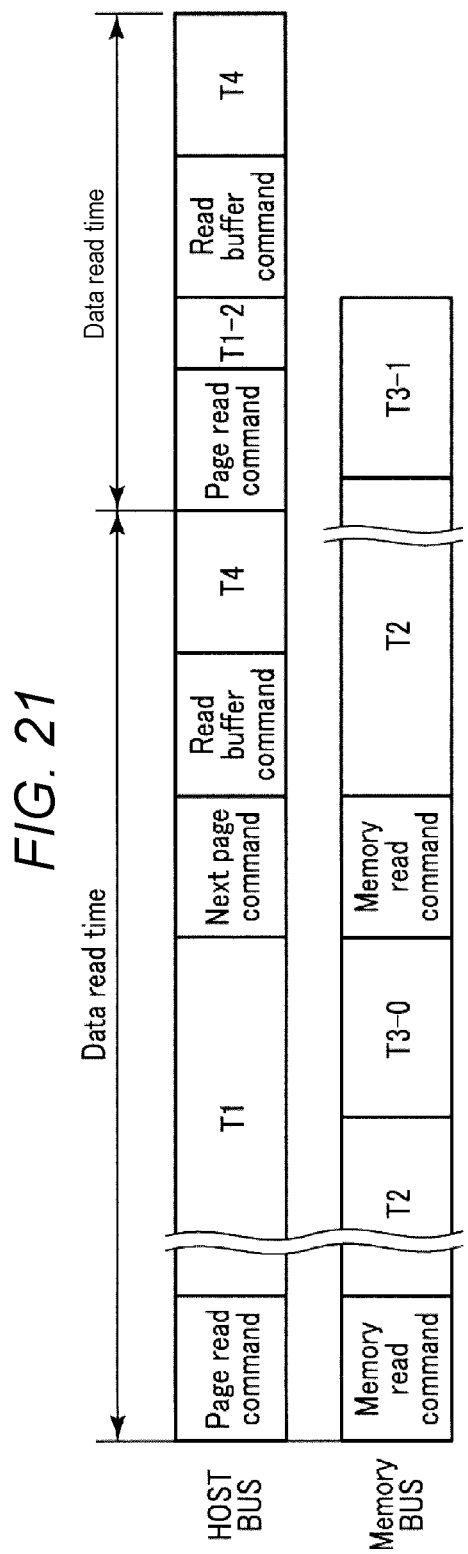
FIG. 21 is a timing chart of the advance reading operation according to the second embodiment.

FIG. 20 is a flowchart illustrating an advance reading operation according to the second embodiment. FIG. 21 is a timing chart of the advance reading operation according to the second embodiment.

Description of components same as the ones described in the first embodiment will be omitted, and only different components will be described hereinafter.

A difference between the advance reading operation according to the first embodiment and the one according to the second embodiment is that a new command (corresponding to "the next page command in FIGS. 20 and 21") for reading any page for which an instruction is given by the host apparatus 500 after the page read command is issued in step S1, and the new command is issued to the controller 200 via the SPI bus (step S11).

In other words, the controller 200 receives the next page command from the host apparatus 500 via the SPI bus after a busy state (T1 in FIGS. 20 and 21) of the SPI bus ends (step S11).

After a read busy time (T2 in FIGS. 20 and 21) of the NAND-type flash memory 100 and a data transmission period (T3-0 in FIGS. 20 and 21) for data transfer from the NAND-type flash memory 100 to the data buffer 270 (data buffer 1) of the controller 200 end, the controller 200 issues a memory read command to the NAND-type flash memory 100 via the NAND bus when the next page command is received in step S11 (step S4).

Thereafter, the controller 200 receives the read buffer command from the host apparatus 500 via the SPI bus (step S3).

Consequently, data can be transmitted from the controller 200 to the host apparatus 500 via the SPI bus, and the data can also be transmitted from the NAND-type flash memory 100 to the controller 200 via the NAND bus.

A timing at which the next page command is issued in step S11 is not limited thereto. The timing may be timing before the controller 200 receives the next page read command from the host apparatus 500.

The next page command in step S11 and the read buffer command in step S3 may be assigned with a new command number as a single command.

Therefore, according to the second embodiment, an advance reading operation on any page can be performed by the host apparatus 500, and thus reading performance in data reading other than the sequential address data reading can be improved.

3. Third Embodiment of Advance Reading Operation

In a third embodiment, reading performance can be improved as a whole by the controller 200 actively switching execution and non-execution of an advance reading operation. The execution and non-execution of the advance reading operation may also be performed by the host apparatus 500.

Figure 22:
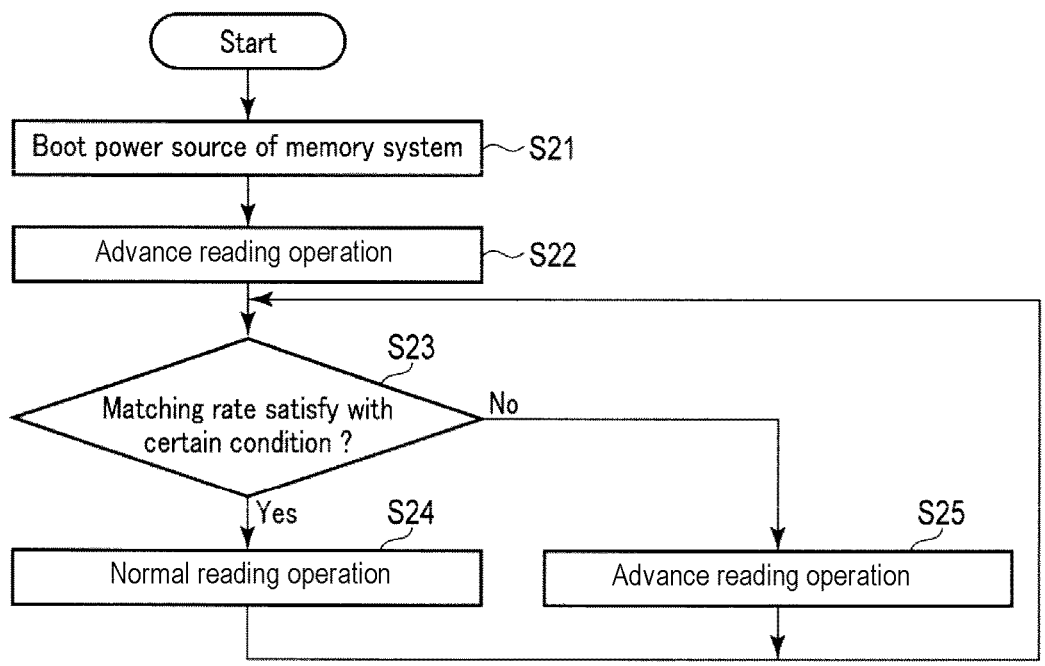
FIG. 22 is a flowchart illustrating switching of functions of an advance reading operation according to a third embodiment.

FIG. 22 is a flowchart illustrating switching of the advance reading operation according to the third embodiment.

As illustrated in FIG. 22, if the memory system is booted (step S21), the advance reading operation described in the first embodiment or the second embodiment is performed (step S22).

Regarding selection of a reading operation, for example, an advance reading register for switching the advance reading operation and the normal reading operation is provided in the feature table, and the switching can be performed by making a value of the advance reading register valid or invalid. In the present embodiment, since a value of the advance reading register is valid when the memory system is booted, the advance reading operation is performed.

Next, it is determined whether or not a matching ratio between a page read address of a memory read command, which is issued on the NAND bus in the advance reading operation, and a page read address of a read command, which is subsequently received on the SPI bus, satisfies a predetermined condition (step S23).

Here, the predetermined condition is that a probability that a page read address of an advance read command which is issued on the NAND bus in the advance reading operation matches a page read address of a read command which is subsequently received on the SPI bus is equal to or less than a threshold value, but is not limited thereto.

For example, the predetermined condition may be that a page read address of an advance read command does not match a page read address of a read command which is subsequently received on the SPI bus.

If the predetermined condition is determined as being satisfied in step S23, the normal reading process as described in "1.2.1 Reading Operation" (normal reading operation) is performed (step S24), and the flow returns to step S23. On the other hand, if the predetermined condition is determined as not being satisfied in step S23, the advance reading operation described in the first embodiment is performed (step S25), and the flow returns to step S23.

Therefore, according to the present embodiment, an advance reading operation is selectively performed by the controller 200 or the host apparatus 500, and thus an efficient advance reading operation can be realized.

Figure 23:
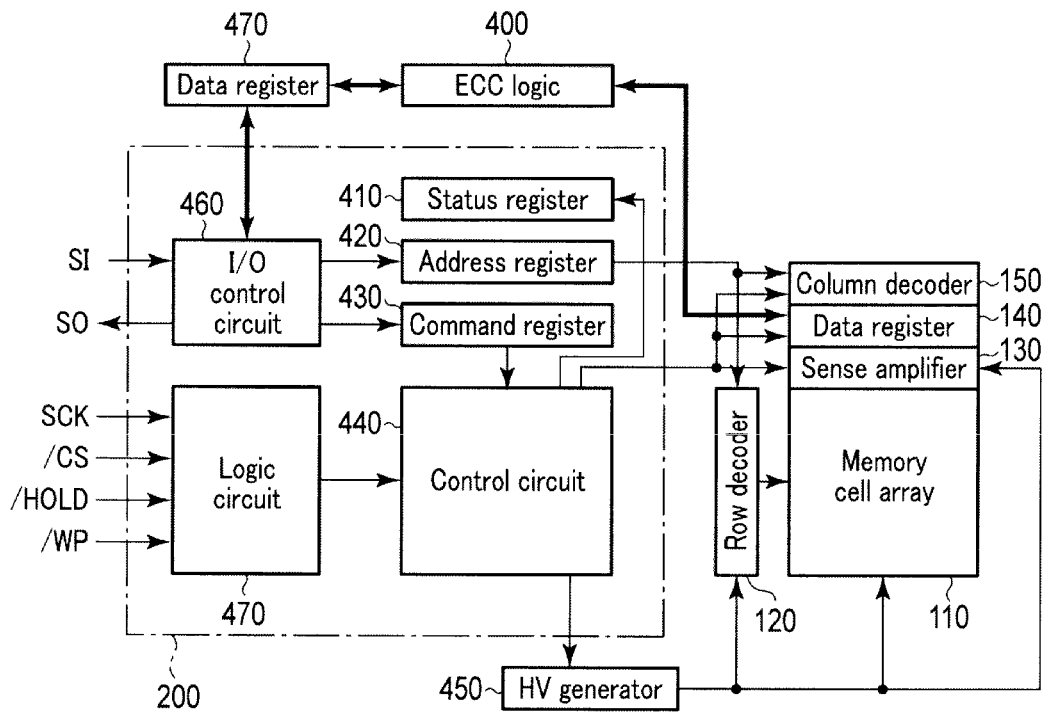
FIG. 23 is a block diagram of a memory system according to a modification example of the first embodiment.

Embodiments are not limited to the above-described embodiments and may have various modifications. For example, in the above-described embodiments, the NAND-type flash memory 100 and the controller 200 are separate semiconductor chips. Alternatively, the elements may be formed of one chip. FIG. 23 is a block diagram of the memory system 1 in this case.

As illustrated, a block configuration is the same as in FIG. 7, but the signals SCK, /CS, /HOLD and /WP from the host apparatus 500 are input to the logic circuit 470, and the signals SI and SO are input and output via the input/output control circuit 460. The registers 410 to 430, the control circuits 440 and 460, and the logic circuit 470 function as the controller 200. In other words, the control circuit 440 functions as the sequencer 250 and the host interface circuit 220, and discriminates commands from the host apparatus 500 from each other by using the signal /CS. The input/output control circuit 460 and the logic circuit 470 function as the host input/output circuit 210. The registers 410 and 420 function as the registers 280 and 290, and the feature table is held in, for example, the status register 410 or the like.

Figure 24:
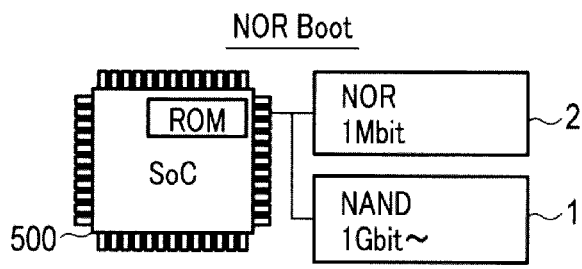
FIGS. 24 and 25 are each a conceptual diagram of a system using the memory system according to the first embodiment.

The memory systems described in each of the above embodiments may be used to activate an application of, for example, a television set or a set top box. FIG. 24 illustrates an example of such a system. In the present example, a NOR-type flash memory 2 is provided in addition to the memory system 1. Both the memory system 1 and the NOR-type flash memory 2 are connected to an SPI interface. In the present example, commands (the commands CMD_RD1, CMD_RD2, CMD_GF, and CMD_SF, and the like) for controlling the memory system 1 are held in the NOR-type flash memory 2. During activation of the host apparatus 500, the host apparatus 500 reads the command information from the NOR-type flash memory 2 according to a sequence held in a ROM of the host apparatus 500. The host apparatus 500 reads an activation sequence from the memory system 1 by using the command information, and the application is activated by executing the activation sequence.

Figure 25:
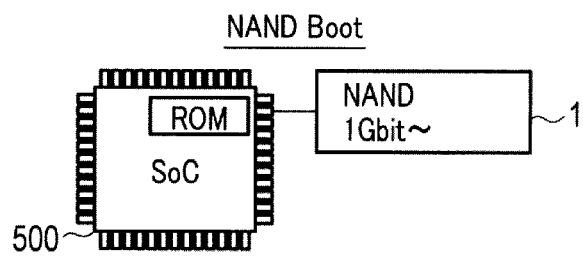

Alternatively, if the command information regarding the memory system 1 is held in the ROM of the host apparatus 500, the NOR-type flash memory 2 may be omitted as illustrated in FIG. 25.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device, comprising:
a semiconductor memory unit; and
a controller configured to communicate with a host through a serial interface and access the semiconductor memory unit in response to commands received through the serial interface, wherein
the controller, in response to a first read command received through the serial interface to read data in a first page of the semiconductor memory unit, issues a first command to the semiconductor memory unit to read data in the first page and, in addition, a second command to read data in a second page that is consecutive to the first page and not specified in the first read command.

2. The memory device according to claim 1, wherein the controller determines a page that is designated in a non-read command received through the serial interface directly after the first read command as the second page.

3. The memory device according to claim 1, wherein the controller includes first and second buffers, the data read from the first page being stored in the first buffer and the data read from the second page being stored in the second buffer.

4. The memory device according to claim 1, wherein the controller issues the second command to the semiconductor memory unit, while sending through the serial interface the data that have been read from the first page in response to the first command.

5. The memory device according to claim 4, wherein the controller includes first and second buffers, the data read from the first page being stored in the first buffer and the data read from the second page being stored in the second buffer.

6. The memory device according to claim 1, wherein
the serial interface conforms to Serial Peripheral Interface (SPI).

7. A memory device, comprising:
a semiconductor memory unit; and
a controller configured to communicate with a host through a serial interface and access the semiconductor memory unit in response to commands received through the serial interface in a plurality of operational states including first and second operational states, wherein
the controller, in the first operational state, in response to a first read command received through the serial interface to read data in a first page of the semiconductor memory unit, issues a first command to the semiconductor memory unit to read data in the first page and, in addition, a second command to read data in a second page that is consecutive to the first page and not specified in the first read command, and
the controller, in the second operational state, in response to the first read command received through the serial interface, issues the first command to the semiconductor memory unit to read data in the first page and does not issue the second command to read data in the second page.

8. The memory device according to claim 7, wherein the controller, in the second operational state, determines a page that is designated in a non-read command received through the serial interface directly after the first read command as the second page.

9. The memory device according to claim 7, wherein the controller, in the second operational state, issues the second command to the semiconductor memory unit, while sending through the serial interface the data that have been read from the first page in response to the first command.

10. The memory device according to claim 9, wherein the controller includes first and second buffers, the data read from the first page being stored in the first buffer and the data read from the second page being stored in the second buffer.

11. The memory device according to claim 7, wherein the operational state of the controller is set based on a command received through the serial interface.

12. The memory device according to claim 11, wherein when the memory device is powered on, the controller initially operates in the first operational state.

13. The memory device according to claim 7, wherein the serial interface conforms to Serial Peripheral Interface (SPI).

14. A method for accessing a semiconductor memory unit of a memory device, comprising:

receiving, from a host through a serial interface, a first read command to read data in a first page of the semiconductor memory unit; and in response to the first read command, issuing a first command to the semiconductor memory unit to read data in the first page and, in addition, a second command to read data in a second page that is consecutive to the first page and not specified in the first read command.

15. The method according to claim 14, further comprising:

receiving, from the host through the serial interface, a non-read command that designates the second page.

16. The method according to claim 14, wherein the second command is issued to the semiconductor memory unit, while the data that have been read from the first page in response to the first command are sent through the serial interface.

17. The method according to claim 14, further comprising:

receiving, from the host through the serial interface, a second read command to read data in the second page of the semiconductor memory unit, wherein at least part of the data in the second page has already been read from the semiconductor memory unit, when the second read command is received.

\* \* \* \* \*